United States Patent [19]  
Bohrn et al.

[11] Patent Number: 4,921,748  
[45] Date of Patent: May 1, 1990

[54] FLUORHECTORITE LAMINATE PRINTED CIRCUIT SUBSTRATE

[75] Inventors: Walter J. Bohrn; William D. DeSantis; Shelly N. Garman, all of Lancaster, Pa.

[73] Assignee: Armstrong World Industries, Inc., Lancaster, Pa.

[21] Appl. No.: 276,819

[22] Filed: Nov. 28, 1988

[51] Int. Cl.⁵ .............................................. B32B 9/00
[52] U.S. Cl. ................................... 428/209; 428/363; 428/36.4; 428/688; 428/696; 428/901; 361/397; 174/255; 174/256; 264/104; 264/109; 264/110
[58] Field of Search ............... 428/209, 363, 364, 688, 428/696, 901; 174/68.5; 361/397; 264/104, 109, 110

[56] References Cited  
U.S. PATENT DOCUMENTS

| | | | |
|---|---|---|---|
| 4,239,519 | 12/1980 | Beall et al. | 65/2 |
| 4,510,230 | 4/1985 | Coreleskie et al. | 430/273 |
| 4,559,264 | 12/1985 | Hoda et al. | 428/324 |
| 4,621,043 | 11/1986 | Gervay | 430/281 |
| 4,775,586 | 10/1988 | Bohrn et al. | 428/454 |

Primary Examiner—Patrick Ryan

[57] ABSTRACT

Synthetic fluorhectorite films impregnated with polyimide resin are stacked, press-laminated and post-cured to produce a printed wiring board substrate with thermal expansion matching ceramic components. The substrate can be cleanly drilled for through-holes and plated without the need to remove residue as with glass-/epoxy boards.

13 Claims, 1 Drawing Sheet

FLUORHECTORITE LAMINATE PRINTED CIRCUIT SUBSTRATE

FIELD OF THE INVENTION

The invention relates to nonconductive substrates for wiring boards or printed circuits. In particular, the invention provides a nonconductive substrate of a synthetic fluorhectorite having unique thermal expansion properties, and a process of manufacture therefor.

BACKGROUND OF THE INVENTION

The nonconductive substrate for wiring boards and printed circuits must have mechanical strength and chemical resistance in addition to good dielectric properties. Most board materials are thermosetting or thermoplastic resins combined with a reinforcing filler. Typical board construction involves combinations such as phenolic or epoxy resins on paper, paper glass composite, polyimide, polytetrafluoroethylene, etc. In most instances, the board is clad with a thin layer of electroconductive metal such as copper.

Glass/epoxy boards have come to be widely used in the industry when a rigid board is required, rather than a flexible circuit board such as a thermosetting resin without reinforcement filler. The availability of these glass/epoxy boards and their desirable properties contribute to their widespread use in spite of known deficiencies. It has been standard practice to clean out residue in through-holes after drilling the glass/epoxy boards in order to obtain good copper coating in the through-holes. Thus, a substrate with superior properties to glass/epoxy which would not require cleaning after through-hole drilling would represent an advance in the state of the art.

It is an object of the invention to provide a novel nonconducting synthetic fluorhectorite substrate which is suitable for printed copper circuitry and surface mounted electronic components.

It is a further object to provide a method for preparing the fluorhectorite substrate.

SUMMARY OF THE INVENTION

The nonconductive substrate for circuitry and electronic components comprises layers of synthetic fluorhectorite impregnated with polyimide and cured and has a thermal coefficient of expansion of 5–12 ppm/°C.

The process for producing the substrate comprises the steps:

(1) applying a solvent solution of a polyimide resin to a potassium exchanged fluorhectorite film;

(2) removing the solvent;

(3) laminating a stack of multiple films to produce a support;

(4) heating the laminate for about 48 hours at about 200°–225° C. to complete curing of the resin; wherein the support can be through-hole drilled and used without requiring removal of residue from the through-hole.

In a preferred process, the solvent is 50/50 acetone/n-methylpyrolidone and the polyimide is Thermid ® 6001 from National Starch and Chemical Co.

DETAILED DESCRIPTION OF THE INVENTION

It is known from U.S. Pat. No. 4,510,230 that a clean substrate is required when producing printed circuits to allow proper adhesion. Thus, prior to lamination of a photopolymerizable composition to a substrate, the substrate may be degreased, scrubbed, soaked, rinsed, dried, etc.

It is also known from U.S. Pat. No. 4,621,043 that substrates with attached solder masks must be able to survive thermal shock such as being subjected to 100 cycles of temperature change from −65° C. to +125° C. Bonding between solder mask and substrate must survive extreme conditions such as in an electronic circuit transported from desert heat to high altitude by an aircraft.

The composition and process of the invention are particularly applicable to the preparation of multilayer circuit boards which are electronically connected via through-holes and employ surface mounted Leadless Ceramic Chip Carriers (LCCC's).

A problem exists in the Printed Wiring Board (PWB) and Printed Circuit (PC) Industries with a thermal mismatch between the ceramic and the conventional glass/epoxy board. Premature component failure often occurs via thermally induced stress cracking of solder joints where the Coefficient of Thermal Expansion (CTE) is 6–6.5 ppm/°C. for the ceramic and 12–16 ppm/°C. for the glass/epoxy. Articles discussing problems with thermal mismatch are: POLYMER/METAL SUBSTRATES MINIMIZE SMD THERMAL EXPANSION PROBLEMS, Electronic Package and Production, February 1984; and JOINT STRENGTH ANALYSIS OF SURFACE MOUNTED COMPONENTS, PC Technical Review, December 1985. Ideally, for a PWB substrate to be suitable for surface mounting of LCCC's, it should have a CTE in the range of 4–12 ppm/°C. and preferably 6–8 ppm/°C. Microelectronics Journal, Vol. 17; No. 2; Pages 21+, N. Sinnadumai et al. gives details of X-Y CTE testing. These procedures were used in testing control and experimental films.

It has been discovered that a substrate with a CTE in the 4.4–7.9 ppm/°C. range can be produced by: applying acetone/n-methylpyrrolidone solution polyimide resin to 0.8 mil potassium fluorhectorite films, removing the acetone/n-methylpyrrolidone, stacking 10 plies of film, pressing at 177° C. for 30 minutes, and post curing the 9.4 mil laminate at 200° C. for 48 hours.

One of the newer techniques employed in attaching components to circuit boards is surface mount. With surface mount, a solder connection is made between the component and the board circuitry. Solder provides both mechanical and electrical connection. However, in cases where the component (eg. an LCCC) is over ½ inch, a problem exists when the expansion of the substrate is significantly different than a ceramic component. The figures illustrate how the surface mount technique differs from the prior soldered lead technique and how the invention provides a significant advance in the art.

DETAILED DESCRIPTION OF THE FIGURES

Figure 1:
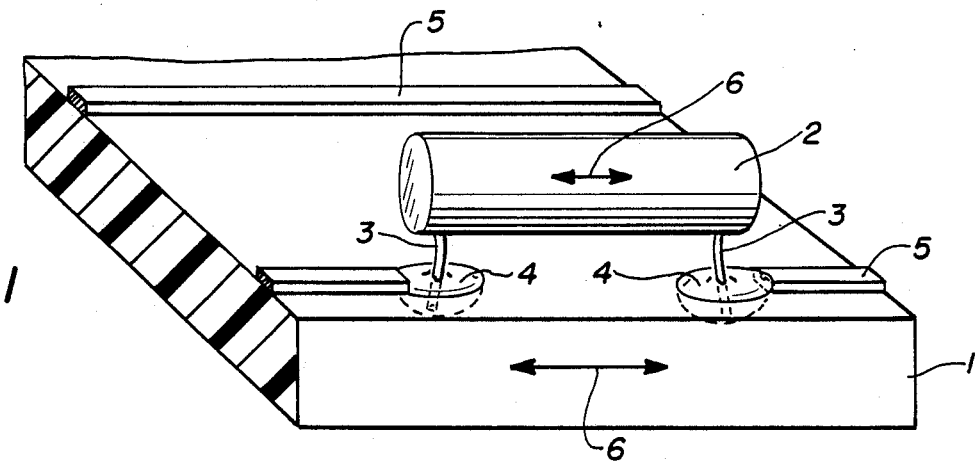
FIG. 1—Thermally stressed leads on a solder mounted ceramic component.

FIG. 1—A ceramic component 2 has leads 3 imbedded in solder 4 and connected with circuitry 5 on a conventional glass/epoxy support 1. Under thermal stress, the relative expansion of 1 and 2 is illustrated by 6. As shown, the greater expansion of 1 relative to 2 has caused the leads 3 to bend, but electrical conductivity is maintained due to the flexibility of the junction.

Figure 2:
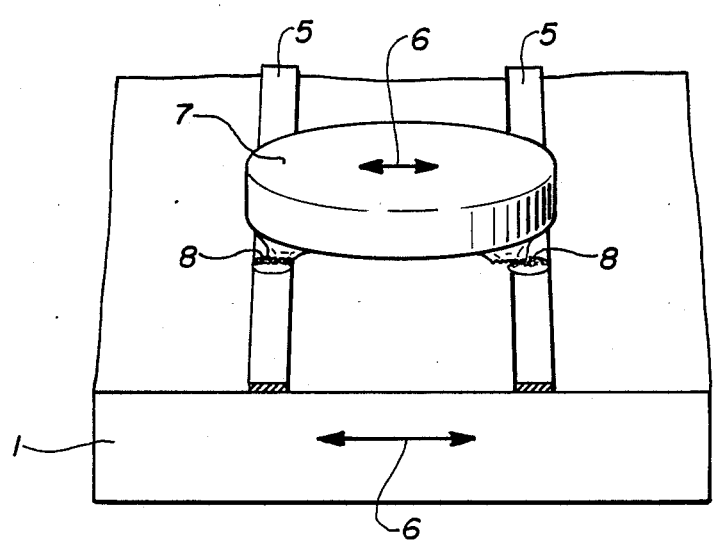
FIG. 2—Surface mount solder cracking with prior art glass/epoxy board.

FIG. 2—Under thermal stress, a ceramic chip 7 has cracked solder joints 8 and is disconnected with circuitry 5 due to the excessive expansion 6 of the support 1 relative to the expansion 6 of the chip 7.

Figure 3:
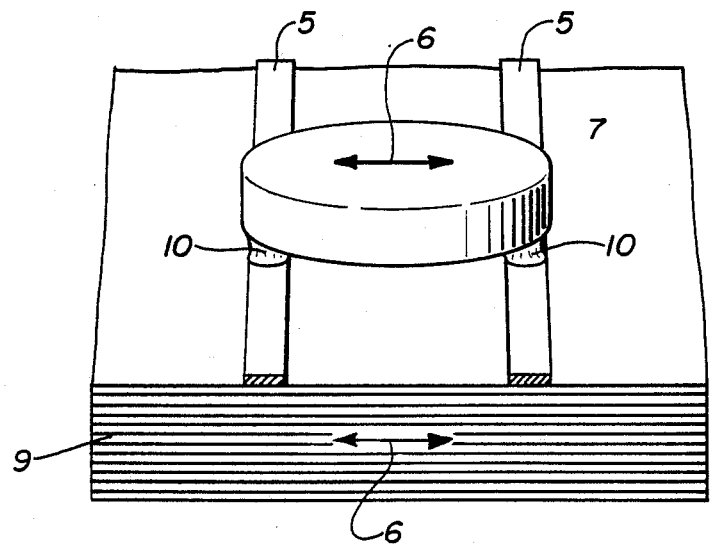
FIG. 3—Intact surface mount with invention substrate matching expansion of ceramic component.

FIG. 3—Under thermal stress, a ceramic chip 7 with intact solder joints 10 maintains contact with circuitry 5 as expansion 6 of 7 and the laminate of the invention 9 match.

Thermally crosslinked polyimide resin is used for preparing the fluorhectorite laminate of the invention. Polyimides are known from U.S. Pat. Nos. 3,700,497; 3,846,166; 3,486,934; 3,515,585; 3,985,597; 4,307,119; and 4,749,621. Commercial sources include Thermid® 6001 from National Starch and Kerimid® 601 from Rhone-Poulenc.

The fluorhectorite films may be produced by K+ exchange in accordance with U.S. Pat. No. 4,239,519 assigned to Corning Glass. While the fluorhectorite film may have a thickness of from 0.3 to 5.0 mils in order to be laminated into a support, it is preferred that the thickness be from 1.0 to 2.0 mils.

The polyimide resin is applied to the film as a solvent solution. While any convenient method may be used to apply the resin solution, it is preferred to immerse the film in the solution for about 30 minutes to allow complete impregnation. After applying Kerimid® 601 resin, the solvent is removed i.e. allowing solvent to evaporate under ambient or elevated temperature conditions followed by oven-drying to drive off residual solvents. A preferred solvent is a 50:50 blend of acetone:n-methyl-pyrrolidone.

To prepare the support, the impregnated films are stacked together and press-laminated. Thus, for example, in starting from room temperature, the film stack may be exposed in sequence to:

(a) 250° F. and 200 psi for one hour;
(b) 350° F. and 300 psi for one hour;
(c) cooling under pressure; and
(d) removal from press.

A post cure step may follow the press-lamination to complete the curing of the resin. For example, a post cure with ramping may involve: (a) ambient to 122° C. in about two hours; (b) 122° C. oven for six hours, (c) 177° C. oven for two hours and (d) 200° C. oven for 48 hours.

The present invention has industrial applicability in the electronics industry to provide a matched thermal expansion substrate for ceramics for printed wiring boards and printed circuits.

The following examples were intended to illustrate the practice of the present invention of which Example 1 represents the best mode.

EXAMPLE 1

A 10% solids lithium fluorhectorite dispersion was prepared according to the procedure taught in U.S. Pat. No. 4,239,519. A film was made of this material by using a Byrd film applicator, which was five inches wide, to draw down a 10 mil thick wet film of the dispersion on a glass plate. The glass plate, with the film attached, was then immersed in a 0.25M potassium chloride solution to cause a cation exchange between the potassium ions and the fluorhectorite interlayer cations. A skin formed on the surface which indicated an exchange was taking place. After ten minutes, the film was removed from the plate, washed in deionized water to remove residual salts, and dried. An about 1 mil film was obtained. The process was repeated to obtain multiple films of potassium fluorhectorite.

The fluorhectorite films were immersed in a 25% by weight solution of Thermid® 6001 polyimide resin in 50:50 acetone:n-methylpyrrolidone. After 30 minutes, the films were removed and allowed to air dry until dry to the touch. The films were then placed in a 122° C. oven and held for 45 minutes to drive off residual solvent. Six of these films were stacked together and placed in a lamination press at room temperature. The films were subjected to 200 psi pressure while the temperature was increased to 122° C. After holding at 122° C. for one hour, the temperature and pressure were increased to 177° C. and 300 psi and held for one hour. Heating was stopped and pressure was held while cooling to room temperature, then the laminate was removed. Using a ramping technique, the laminate support was post-cured by being heated in an oven sequentially: ambient to 122° C.—two hours, 122° C.—six hours, 177° C.—two hours; 200° C.—48 hours. The final support had a thickness of 17.6 mils. The coefficient of linear thermal expansion (CTE) was measured according to IPC Test Methods Manual Number 2.4.41 published March 1986. The support gave a X-Y CTE of 5.9–6.8 ppm/°C. compared to a X-Y CTE of 6.0–7.0 ppm/°C. for a Leadless Ceramic Circuit Chip Carrier (LCCC).

The support can be drilled in the manner used for producing through holes for multilayer circuit boards withhout residue remaining in the holes after drilling. The holes can be electroless plated with copper to produce a smooth plated through hole. In contrast, a glass/epoxy board can not be similarly plated due to residue in the hole after drilling.

Thus, this example exhibits the dual advantages of CTE and clean hole drilling for a substrate.

Commercially available glass epoxy and glass polyimide circuit boards were compared to the potassium fluorhectorite support of the invention. Table 1 contains comparative results.

TABLE 1

| Laminate Description | CTE X-Y PMM/°C. | Electrical | |
| --- | --- | --- | --- |
| | | DC 1MHz | DF 1MHz |
| K+ —FH w/Ther. 6001 | 5.9–6.8[1] | 4.1 | 0.030 |
| Epoxy-Glass (FR-4) | 14–18 | 4.5–5.0 | 0.020 |
| Polyimide-Glass | 12–18 | 4.2–5.0 | 0.010 |

[1]Measured over a temperature range of −55 to +125° C.

EXAMPLE 2

Supports were prepared as in Example 1 except that resin solution was applied by coating and dip saturation. Except for the single side application, it was possible to prepare a support with improved thermal expansion and hole drilling properties as in Example 1. Table 2 summarizes the results.

TABLE 2

| Film | Resin | Resin Application Process | No. of Plies | Laminate Thickness Mils | CTE PPM/°C. −55° To +125° C. |
|---|---|---|---|---|---|
| K+−FH | Ker. 601 | Single Side | 72 | 54 | N/A-6.6 |
| K+−FH | Ker. 601 | Both Sides | 72 | 55 | 5.1-7.5 |
| K+−FH | Ker. 601 | Dip | 72 | 54 | 5.8-6.4 |
| K+−FH | Ker. 601 | Dip | 50 | 42.5 | 11.9-12.3 |

While CTE and electrical results were generally satisfactory, a single sided coating process produces a generally unsatisfactory substrate that is prone to delaminate upon application of mechanical stress and/or high temperatures such as in soldering processes.

What is claimed is:

1. A nonconductive substrate for electrical circuitry comprising laminated films of potassium fluorhectorite impregnated with thermally cured polyimide resin, wherein the substrate has a thermal coefficient of expansion of 5-12 ppm/°C.

2. The substrate of claim 1 with a thermal coefficient of expansion of 6-8 ppm/°C.

3. The substrate of claim 1 having surface mounted leadless ceramic chip carriers.

4. The substrate of claim 3 having multilayer circuits and through-holes.

5. The substrate of claim 1 wherein the film has a thickness in the range of from 0.3 to 5 mils.

6. The substrate of claim 1 wherein the film has a thickness in the range of from 1 to 2 mils.

7. The substrate of claim 3 having a thermal coefficient of expansion of 6-8 PPM/°C.

8. A process for producing a printed wiring board or printed circuit substrate comprising:
    (1) applying a solvent solution of a polyimide resin to a potassium exchanged fluorhectorite film;
    (2) removing the solvent;
    (3) laminating a stack of multiple films to provide a support, and
    (4) heating the support at 200°-225° C. to complete curing at the resin, and produce the substrate having a thermal coefficient of expansion 5-12 PPM/°C.

9. The process of claim 8 wherein the solvent is 50:50 acetone:n-methylpyrrolidone.

10. The process of claim 9 wherein the heating is conducted for a time of at least 48 hours.

11. A process as described in claim 8 wherein the potassium exchanged fluorhectorite film had a thickness in the range of from 1 to 2 mils.

12. A process as described in claim 8 wherein the film had a thickness in the range of from 0.3 to 5 mils.

13. A process as described in claim 8 wherein the solvent solution is applied to both sides of the film.

* * * * *